US009726710B2

(12) United States Patent
Ghosh et al.

(10) Patent No.: US 9,726,710 B2
(45) Date of Patent: Aug. 8, 2017

(54) METHODS AND SYSTEMS FOR PREDICTION OF FILL FACTOR IN HETEROJUNCTION SOLAR CELLS THROUGH LIFETIME SPECTROSCOPY

(71) Applicants: Kunal Ghosh, Tempe, AZ (US); Stuart Bowden, Tempe, AZ (US)

(72) Inventors: Kunal Ghosh, Tempe, AZ (US); Stuart Bowden, Tempe, AZ (US)

(73) Assignee: Arizona Board of Regents, a body corporate of the State of Arizona, acting for and on behalf of Arizona State University, Scottsdale, AZ (US)

( * ) Notice: Subject to any disclaimer, the term of this patent is extended or adjusted under 35 U.S.C. 154(b) by 683 days.

(21) Appl. No.: 14/086,387

(22) Filed: Nov. 21, 2013

(65) Prior Publication Data

US 2014/0142882 A1    May 22, 2014

Related U.S. Application Data

(60) Provisional application No. 61/729,246, filed on Nov. 21, 2012.

(51) Int. Cl.
*G01R 31/26* (2014.01)
*H02S 50/10* (2014.01)

(52) U.S. Cl.
CPC .......... *G01R 31/2605* (2013.01); *H02S 50/10* (2014.12)

(58) Field of Classification Search
CPC ................................................ G01R 31/2605
See application file for complete search history.

(56) References Cited

U.S. PATENT DOCUMENTS

| 5,316,593 A * | 5/1994 | Olson | H01L 31/02168 |
| | | | 136/262 |
| 5,342,453 A * | 8/1994 | Olson | H01L 31/02168 |
| | | | 136/262 |
| 8,679,361 B2 * | 3/2014 | Muller | G01R 31/2648 |
| | | | 216/83 |
| 2003/0070707 A1 * | 4/2003 | King | H01L 31/02168 |
| | | | 136/255 |
| 2003/0145884 A1 * | 8/2003 | King | H01L 31/02168 |
| | | | 136/255 |
| 2005/0009228 A1 * | 1/2005 | Wu | C23C 14/0036 |
| | | | 438/95 |

(Continued)

OTHER PUBLICATIONS

Cuevas, A. "Measuring and interpreting the lifetime of silicon wafers," In Solar Energy, vol. 76, Jan. 2004, pp. 255-262.

(Continued)

*Primary Examiner* — Manuel L Barbee
*Assistant Examiner* — Raymond Nimox
(74) *Attorney, Agent, or Firm* — Byrne Poh LLP (57) ABSTRACT

Methods and systems for prediction of fill factor in heterojunction solar cells through lifetime spectroscopy are provided. In accordance with some embodiments, methods for categorizing fill factor in a solar cell are provided, the methods comprising: determining lifetime values of the solar cell at different minority carrier concentrations; determining a lifetime curve shape for the solar cell based on the determined lifetime values; and categorizing the fill factor of the solar cell based on the determined lifetime curve shape using a hardware processor.

14 Claims, 6 Drawing Sheets

(56) References Cited

U.S. PATENT DOCUMENTS

| | | | | |
|---|---|---|---|---|
| 2005/0151131 A1* | 7/2005 | Wager | ............... | H01L 31/0272 257/51 |
| 2007/0227587 A1* | 10/2007 | Walsh | ................... | H01L 31/075 136/252 |
| 2011/0256659 A1* | 10/2011 | Takahashi | ......... | H01L 31/02246 438/71 |
| 2012/0181452 A1* | 7/2012 | Trupke | ............... | G01N 21/6489 250/459.1 |
| 2013/0263923 A1* | 10/2013 | Jones-Albertus | ... | H01L 31/0725 136/262 |
| 2014/0087513 A1* | 3/2014 | Chen | .................... | H01L 31/068 438/96 |

OTHER PUBLICATIONS

Froitzheim, A., et al., "Interface recombination in heterojunctions of amorphous and crystalline silicon," In Journal of Non-Crystalline Solids, vol. 299-302, Apr. 2002, pp. 663-667.

Garin, M., et al., "Characterization of a—Si : H /c—Si interfaces by effective-lifetime measurements," In Journal of Applied Physics, vol. 98, Nov. 2005, pp. 1-9.

Ghosh, K., "Heterojunction and Nanostructured Photovoltaic Device—Theory and Experiment," Dissertation, Arizona State University, Dec. 2011, pp. 1-126.

Ghosh, K., et al., "Explanation of the device operation principle of amorphous silicon/crystalline silicon heterojunction solar cell and role of the inversion of crystalline silicon surface," In Proceedings of the 35th IEEE PVSC, Hawaii, USA, Jun. 20-25,2010, pp. 1383-1386.

Lu, M., "Silicon Heterojunction Solar Cell and Crystallization of Amorphous Silicon," PhD thesis, University of Delaware, 2008 (month unknown), pp. 1-271.

Olibet, S., et al., "Model for a—Si:H/c—Si interface recombination based on the amphoteric nature of silicon dangling bonds," In Physical Review B, vol. 76, Jul. 2007, pp. 1-14.

Schmidt, J., "Temperature-and injection-dependent lifetime spectroscopy for the characterization of defect centers in semiconductors," In Applied Physics Letters, vol. 82, Mar. 2003, pp. 2178-2180.

Schmidt, J., et al., "Advances in Contactless Silicon Defect and Impurity Diagnostics Based on Lifetime Spectroscopy and Infrared Imaging," In Advances in OptoElectronics, vol. 2007, Apr. 2007, pp. 1-9.

Schmidt, J., et al., "Impact of Light-induced Recombination Centres on the Current-Voltage Characteristic of Czochralski Silicon Solar Cells," In Progress in Photovoltaics, vol. 9, No. 4, May 2001, pp. 249-255.

Schultz, O., "High-Efficiency Multicrystalline Silicon Solar Cells," PhD Thesis, University of Konstanz, 2005 (month unknown), pp. 1-198.

Sharma, P., et al., "Characterization and modeling of flexible photovoltaic modules for portable power applications," In Proceedings of the International Conference on Sustainable Power Generation and Supply, Apr. 6-7,2009, Nanjing, CN, pp. 1-7.

Warta, W., "Defect and impurity diagnostics and process monitoring," In Solar Energy Materials & Solar Cells, vol. 72, Apr. 2002, pp. 389-401.

Zhang, Y., et al., "Effect of Charge Recombination on the Fill Factor of Small Molecule Bulk Heterojunction Solar Cells," In Advanced Energy Materials, vol. 1, No. 4, Jun. 2011, pp. 610-617.

\* cited by examiner

METHODS AND SYSTEMS FOR PREDICTION OF FILL FACTOR IN HETEROJUNCTION SOLAR CELLS THROUGH LIFETIME SPECTROSCOPY

CROSS REFERENCE TO RELATED APPLICATION

This application claims the benefit of U.S. Provisional Patent Application No. 61/729,246, filed Nov. 21, 2012, which is hereby incorporated by reference herein in its entirety.

STATEMENT REGARDING FEDERALLY SPONSORED RESEARCH OR DEVELOPMENT

This invention was made with government support under contract 1041895 awarded by the National Science Foundation. The government has certain rights in the invention.

TECHNICAL FIELD

The invention relates to methods and systems for prediction of fill factor in heterojunction solar cells through lifetime spectroscopy.

BACKGROUND

Figure 1:
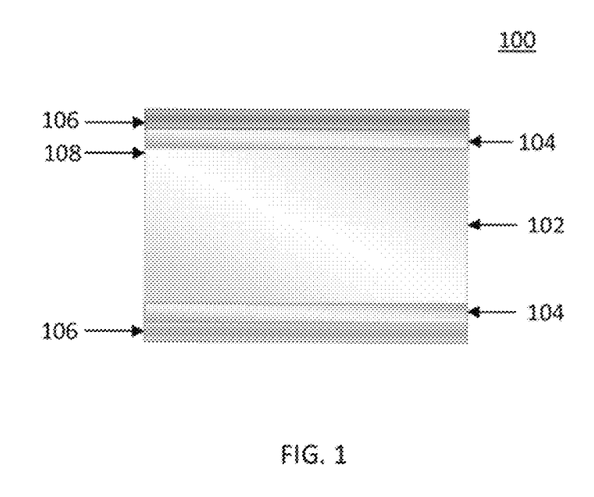
FIG. 1 illustrates an example of a schematic of a heterojunction solar cell in accordance with some embodiments.

A heterojunction solar cell is a solar cell that includes a heterojunction at an interface between two different semiconductors in the solar cell. A heterojunction solar cell can include a base layer, an intrinsic layer, and an emitter layer. FIG. 1 shows an example of a heterojunction solar cell 100 which includes a base crystalline silicon layer (c-Si) 102, an intrinsic amorphous silicon (a-Si) layer 104, a doped amorphous silicon (doped a-Si) layer 106, and a heterointerface 108 between semiconductor layers 102 and 104.

The base layer in a heterojunction solar cell can act as the primary light absorber. From this layer, photogenerated minority carriers can cross the heterointerface and the intrinsic layer before being collected as majority carriers in the emitter layer. The photogenerated minority carriers can cross the heterointerface either by tunneling, thermionic emission, or both depending on the heterojunction solar cell's operating point.

A band offset occurs at the heterointerface(s), such as heterointerface 108, in a heterojunction solar cell. At thermal equilibrium, Fermi-level constancy is maintained when the heterojunction solar cells undergo band bending at the heterointerface. For a fixed band offset, the strength of the band bending can depend on doping of the emitter layer, thickness of the intrinsic layer, as well as defects at the heterointerface. Strong band bending may assist in thermionic emission by lowering an effective barrier. Strong band bending may also assist in tunneling by decreasing effective barrier thickness. Additionally, strong band bending of the base layer surface can be associated with a strong electric field in the intrinsic layer and hence can assist in transporting minority carriers across the intrinsic layer.

Inversion of the heterointerface may also depend on the strength of the band bending, and fill factor can be influenced by inversion of the base layer. Fill factor is a measure of efficiency in heterojunction solar cells and is defined as the ratio of the maximum available power versus the product of the open circuit voltage and the short circuit current. A heterojunction solar cell with a high fill factor has a low series resistance and a high shunt resistance, which signifies smaller losses in current production internally. An increase in inversion of the base layer surface can result in a heterojunction solar cell with a high fill factor, whereas, a decrease in inversion of the base layer surface can result in a lower fill factor.

Manufacturing heterojunction solar cells with high fill factors is desirable. Unfortunately, however, determining that a heterojunction solar cell in the process of being manufactured has a high fill factor can be difficult. For example, in current techniques, a metalization layer typically needs to be applied to a solar cell so that fill-factor measurements on the solar cell can be made. The process of applying such a metalization layer can be time-consuming and expensive. Moreover, once the metalization layer has been applied, it is difficult to determine whether poor fill factor is due to the metalization lay or due to inherent properties of the solar cells.

Accordingly, new mechanisms for identifying heterojunction solar cells with high fill factors are desirable.

SUMMARY

Methods and systems for prediction of fill factor in heterojunction solar cells through lifetime spectroscopy are provided. In accordance with some embodiments, methods for categorizing fill factor in a solar cell are provided, the methods comprising: determining lifetime values of the solar cell at different minority carrier concentrations; determining a lifetime curve shape for the solar cell based on the determined lifetime values; and categorizing the fill factor of the solar cell based on the determined lifetime curve shape using a hardware processor.

In accordance with some embodiments, systems for categorizing fill factor in a solar cell are provided, the systems comprising: at least one hardware processor that: determines lifetime values of the solar cell at different minority carrier concentrations; determines a lifetime curve shape for the solar cell based on the determined lifetime values; and categorizes the fill factor of the solar cell based on the determined lifetime curve shape.

DESCRIPTION OF THE DRAWINGS

Various objects, features, and advantages of the present invention can be more fully appreciated with reference to the following detailed description of the invention when considered in connection with the following drawings, in which like reference numerals identify like elements.

DETAILED DESCRIPTION

In accordance with some embodiments, systems and methods for prediction of fill factor in heterojunction solar cells through lifetime spectroscopy are provided.

In accordance with some embodiments, predicting the fill factor of a heterojunction solar cell based on material properties of the solar cell can allow for the creation of heterojunction solar cells which are more efficient. In some embodiments, measurements of carrier lifetime (i.e., carrier lifetime spectroscopy) can be used to determine the material properties of a solar cell, to predict whether the solar cell has a high fill factor, and to improve heterojunction solar cell manufacturing. In some embodiments, measurements of carrier lifetime of a solar cell and prediction of fill factor of the solar cell can be performed prior to application of a metalization layer to the solar cell, therefore making the determination of the efficiency of the solar cell possible at an earlier manufacturing step than previously possible. Because the fill factor of the solar cell can be determined prior to metalization, a determination of whether a subsequent application of a metalization layer makes the fill factor worsen is made possible.

Figure 2:
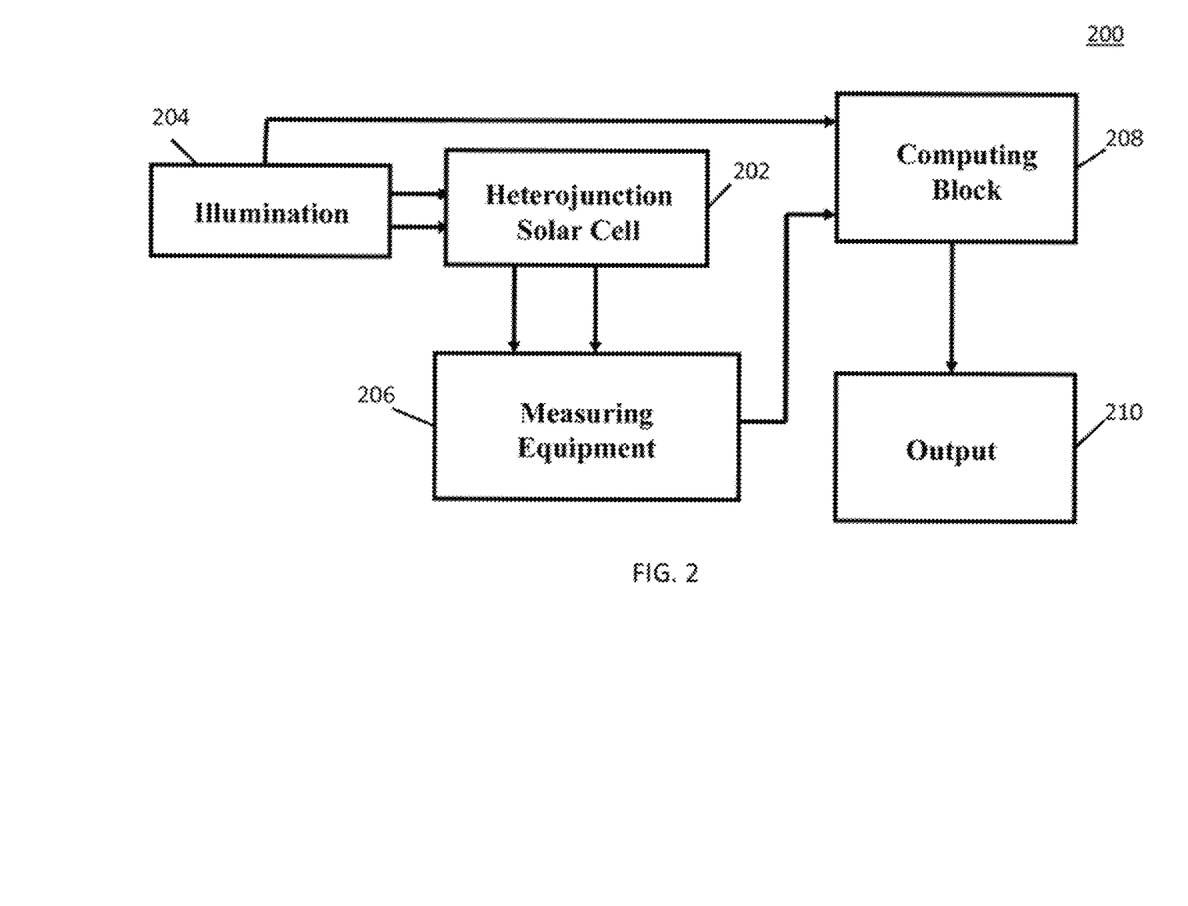
FIG. 2 illustrates an example of hardware that can be used in accordance with some embodiments.

In accordance with some embodiments, an example of hardware 200 for measuring carrier lifetime is shown FIG. 2. As illustrated, hardware 200 can include a heterojunction solar cell 202, an illumination source 204, measuring equipment 206, a computing block 208, and an output device 210.

In accordance with some embodiments, illumination source 204 can be used to provide light at an intensity required for creating photogenerated minority carriers in heterojunction solar cell 202. Illumination source 204 can be any suitable source of light in some embodiments.

In accordance with some embodiments, measuring equipment 206 can be used to measure changes in one or multiple parameters of the heterojunction solar cell in response to the light provided by illumination source 204. Measuring equipment 206 can be any suitable measuring equipment in some embodiments. For example, in some embodiments, measuring equipment 206 can be a WCT-120 from Sinton instruments, which is based on photoconductance decay. The equipment uses broad spectrum light source with a red filter for illumination. The photoconductivity of the sample is measured with an inductively coupled bridge circuit while the illumination of the light source is measured simultaneously by a calibrated concentrator solar cell.

In accordance with some embodiments, computing block 208 can be used to calculate the minority carrier lifetime as a function of the minority carrier concentration of the heterojunction solar cell. This calculation can be based on information on the intensity of illumination as well as other parameters, such as the photoconductance measured by the measuring equipment. Computing block 208 can be implemented using any suitable hardware in some embodiments. For example, in some embodiments, computing block 208 can be implemented using any suitable general purpose computer or special purpose computer. Any such general purpose computer or special purpose computer can include any suitable hardware. For example, in some embodiments, such hardware can include a hardware processor, memory and/or storage, etc. Such a hardware processor can include any suitable hardware processor, such as a microprocessor, a micro-controller, digital signal processor, dedicated logic, and/or any other suitable circuitry for controlling the functioning of a general purpose computer or special purpose computer in some embodiments. Such memory and/or storage can be any suitable memory and/or storage for storing programs, data, measurements, etc. in some embodiments. For example, the memory and/or storage can include random access memory, read only memory, flash memory, hard disk storage, optical media, etc.

In accordance with some embodiments, output device 210 can than provide information on the carrier lifetime of solar cell 202 to a user and/or another device (not shown). Output device 210 can be any suitable one or more output devices for providing output in some embodiments. For example, output device 210 can include a display, an audio device, etc. Output device 210 can additionally or alternatively include one or more communication interface(s) that can be any suitable circuitry for interfacing with one or more other devices, communication networks, etc. in some embodiments. For example, these interface(s) can include network interface card circuitry, wireless communication circuitry, etc.

Any other suitable components can be included in hardware 200 in accordance with some embodiments. Any suitable components illustrated in hardware 200 can be combined and/or omitted in some embodiments.

In accordance with some embodiments, components 204, 206, 208, and 210 can be implemented in a WCT-120 offline wafer lifetime measurement instrument available from Sinton Instruments of Boulder, Colo.

In response to illumination, photoconductance of the solar cell can be measured. Excess minority carrier concentration can be obtained from the photoconductance while information on photointensity can be given by a reference cell used in measuring equipment 208. The information on photointensity and photoconductance variation can be used by the computing block to generate the minority carrier lifetime as a function of its concentration from which a lifetime curve can be plotted.

In accordance with some embodiments, a lifetime curve is a plot of minority carrier lifetime (tau) as a function of minority carrier concentration (MCD). In a heterojunction solar cell with a high bulk lifetime (>1 ms), tau can be determined by surface recombination velocity at the heterointerface. For heterojunction solar cells where the heterointerface is strongly inverted at thermal equilibrium, tau at a low MCD may be higher than at a moderate to a high MCD. At a low MCD, charges due to photogenerated carriers may not alter the band bending of the heterointerface and the effective surface recombination velocity can be small. As the carrier concentration starts to increase, charges can begin to alter the band bending and subsequently, inversion. The heterointerface can begin to move from inversion to a flat band condition, which can result in an increased effective surface recombination velocity and lower lifetime. In a heterojunction solar cell with no inversion at all, the heterointerface can be more active at a low MCD than at a high MCD (heterointerface at flat band condition), which can result in an increase in the lifetime from a low MCD to a high MCD.

Figure 3:
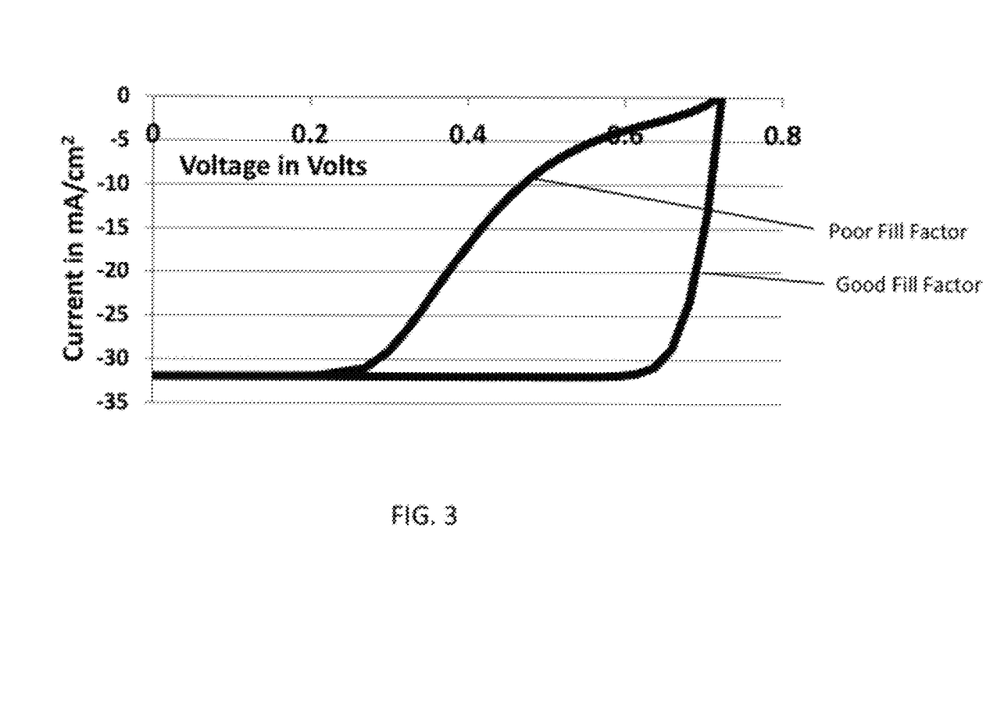
FIG. 3 is an example of a graph of Current (mA/cm$^2$) versus Voltage (V) showing a simulated illuminated current-voltage relationships for poor fill factor and good fill factor in a heterojunction solar cell in accordance with some embodiments.
Figure 4:
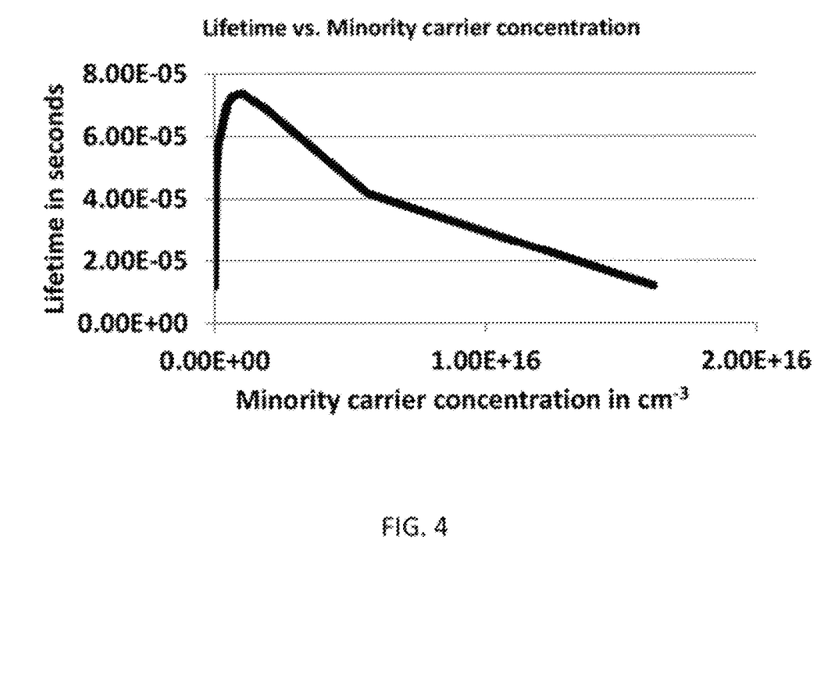
FIGS. 4 and 5 are lifetime curves showing lifetimes (s) versus minority carrier concentration (cm$^{-3}$) in accordance with some embodiments.
Figure 5:
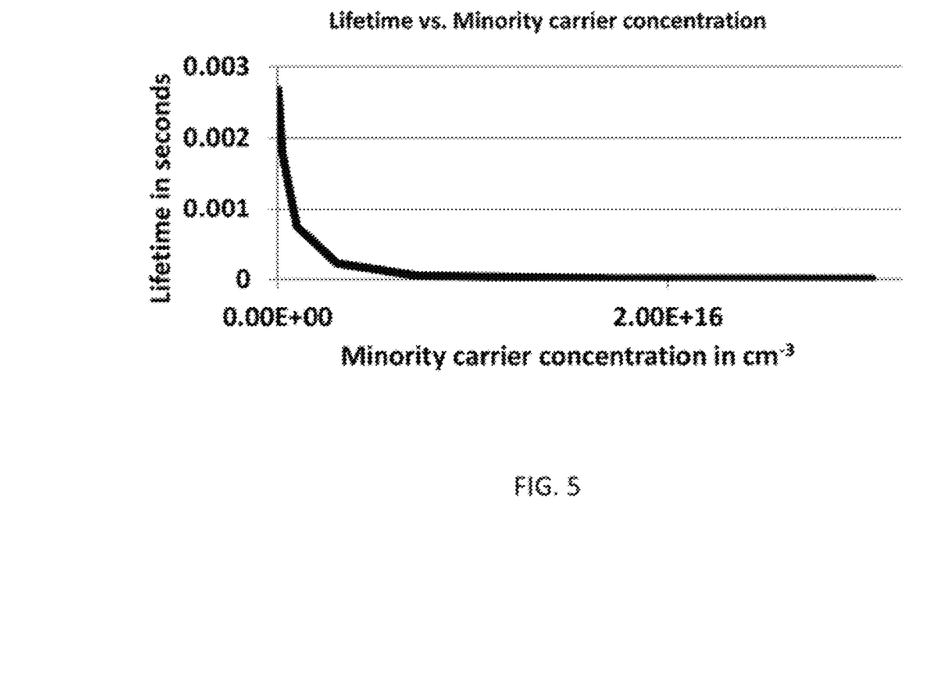

In accordance with some embodiments, simulated measurement of a lifetime curve for a heterojunction solar cell can be generated using a computer model developed in the Sentaurus simulator available from Synopsys, Inc. of Mountain View, Calif. A lifetime curve in the Sentaurus simulator can be obtained by using the following relationship:

$$\tau = \frac{MCD * W}{G}$$

where, W is the thickness of the device, MCD is the minority carrier density of the device, G is the optical generation rate of the device, and $\tau$ is the lifetime of the device. FIG. 3 shows a simulated illuminated current-voltage relationship, while FIGS. 4 and 5 show simulated lifetime curves.

In accordance with some embodiments, the simulated curve in FIG. 4 shows that in a heterojunction solar cell with a low factor, the lifetime is less at low MCD and the lifetime increases with increasing MCD. At high MCD, however, the lifetime starts to decrease because of increased Auger recombination. From FIG. 5, it can be seen that, for a heterojunction solar cell with high fill factor, the lifetime at low MCD is high, but the lifetime decreases with increasing MCD—indicating a correlation between the fill factor and the lifetime curve.

In accordance with some embodiments, the mechanisms described herein can identify whether change in fill factor is due to contacts to the heterojunction solar cell or is inherent (defect density at the heterointerface, band offset, and intrinsic layer thickness) and can assist in optimizing the intrinsic layer properties, as well as deposition processes to obtain higher efficiency a heterojunction solar cell with high fill factor.

Figure 6:
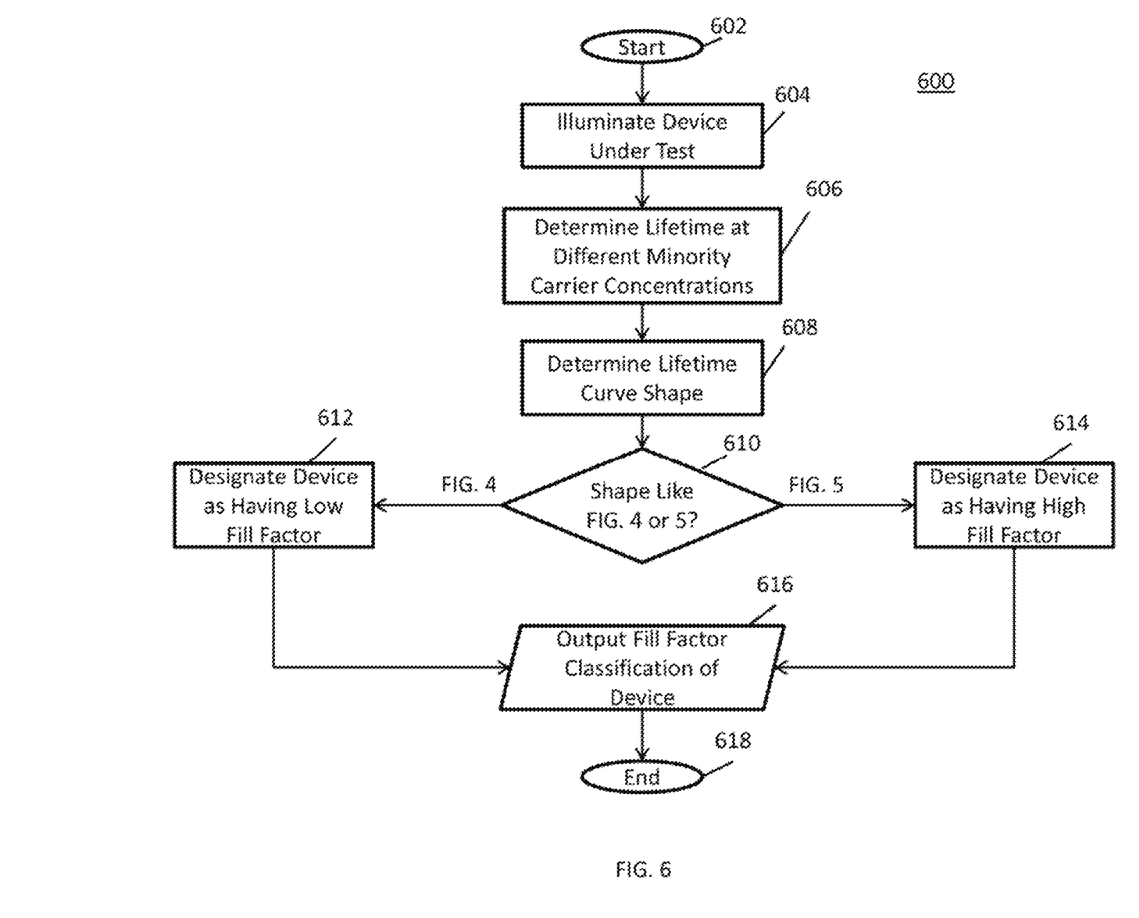
FIG. 6 is an example of a process for classifying the fill factor of a heterojunction solar cell in accordance with some embodiments.

Turning to FIG. 6, an example 600 of a process for determining whether a heterojunction solar cell has a high fill factor or a low fill factor is shown. As illustrated, after process 600 begins at 602, the process illuminates a device under test. Any suitable illumination can be provided, and any suitable variation in the intensity and duration of illumination can be provided. For example, in some embodiments, the illumination can be varied so as to realize a variety of minority carrier concentrations in the device under test. Next, at 606, process 600 can determine lifetime values for the device under test at different minority carrier concentrations. Base on the measurements at 608, process 600 can then determine a lifetime curve shape associated with the device under test. This determination can be made in any suitable manner. Then, at 610, the process can determine whether the shape of the curve is more like FIG. 4 or FIG. 5. This determination can be made in any suitable manner. If the shape of the curve is more like FIG. 4, then process 600 can designate the device as having a low fill factor. Otherwise, if the shape of the curve is more like FIG. 5, then process 600 can designate the device as having a high fill factor. Finally, process 600 can output the fill factor classification of the device at 616 and end at 618. This classification can be output to any suitable user or device in some embodiments.

It should be understood that at least some of the above described steps of process 600 of FIG. 6 can be executed or performed in any order or sequence not limited to the order and sequence shown and described in the figure. Also, some of the above steps of process 600 of FIG. 6 can be executed or performed substantially simultaneously where appropriate or in parallel to reduce latency and processing times.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claim which follows. Features of the disclosed embodiments can be combined and rearranged in various ways.

What is claimed is:

1. A method for manufacturing solar cells, comprising:
prior to a metallization layer being applied to a first solar cell during a manufacturing of the first solar cell:
illuminating the first solar cell using an illumination source having a selective illumination intensity, wherein the selective illumination intensity is configured to create photogenerated minority carriers in the first solar cell;
measuring a photoconductivity of the first solar cell in response to the illumination source using an inductively coupled bridge circuit;
measuring an illumination of the first solar cell resulting from the illumination source using a second solar cell;
determining lifetime values of the first solar cell at different minority carrier concentrations using a hardware processor;
determining a shape of a lifetime curve for the first solar cell based on the determined lifetime values using the hardware processor; and
determining a fill factor of the first solar cell based on the determined shape of the lifetime curve using the hardware processor; and
applying the metallization layer to the first solar cell;
determining whether the application of the metallization layer to the first solar cell has worsened the fill factor of the first solar cell; and
based on the determined fill factor of the first solar cell and the determining of whether the application of the metallization layer to the first solar cell has worsened the fill factor of the first solar cell, altering intrinsic layer properties and deposition processes in a solar cell manufacturing process to obtain a solar cell with high fill factor,
wherein the lifetime curve is determined using the following equation:

$$\tau = MCD * W / G$$

where: $\tau$ is a lifetime value of the first solar cell;
MCD is a minority carrier density of the first solar cell;
W is a thickness of the first solar cell; and
G is an optical generation rate of the first solar cell.

2. The method of claim 1, wherein the first solar cell is a heterojunction solar cell that includes a base layer, an intrinsic layer, and an emitter layer.

3. The method of claim 2, wherein the base layer acts as a primary light absorber, wherein photogenerated minority carriers cross the intrinsic layer before being collected as majority carriers in the emitter layer.

4. The method of claim 1, wherein the lifetime curve is a plot of minority carrier lifetimes as a function of minority carrier concentrations.

5. The method of claim 4, wherein the minority carrier lifetimes are determined by surface recombination velocity at a heterointerface.

6. The method of claim 1, wherein the fill factor is determined as being low when the lifetime values increase as the minority carrier concentrations increase.

7. The method of claim 1, wherein the fill factor is determined as being high when the lifetime values decrease as the minority carrier concentrations increase.

8. A system for manufacturing solar cells, comprising:
an illumination source having a selective illumination intensity, wherein the selective illumination intensity is configured to create photogenerated minority carriers in the first solar cell, and wherein the illumination source illuminates a first solar cell;
an inductively coupled bridge circuit that measures a photoconductivity of the first solar cell in response to the illumination source;
a second solar cell that measures an illumination of the first solar cell resulting from the illumination source;
at least one hardware processor that:
prior to a metallization layer being applied to the first solar cell during a manufacturing of the first solar cell:
determines lifetime values of the first solar cell at different minority carrier concentrations;
determines a shape of a lifetime curve for the first solar cell based on the determined lifetime values; and
determines a fill factor of the first solar cell based on the determined shape of the lifetime curve;
after the metallization layer has been applied to the first solar cell, determines whether the application of the metallization layer to the first solar cell has worsened the fill factor of the first solar cell; and
based on the determined fill factor of the first solar cell and the determining of whether the application of the metallization layer to the first solar cell has worsened the fill factor of the first solar cell, alters intrinsic layer properties and deposition processes in a solar cell manufacturing process to obtain a solar cell with high fill factor,
wherein the lifetime curve is determined using the following equation:

$$\tau = MCD * W/G$$

where: $\tau$ is a lifetime value of the first solar cell;
MCD is a minority carrier density of the first solar cell;
W is a thickness of the first solar cell; and
G is an optical generation rate of the first solar cell.

9. The system of claim 8, wherein the first solar cell is a heterojunction solar cell that includes a base layer, an intrinsic layer, and an emitter layer.

10. The system of claim 9, wherein the base layer acts as a primary light absorber, wherein photogenerated minority carriers cross the intrinsic layer before being collected as majority carriers in the emitter layer.

11. The system of claim 8, wherein the lifetime curve is a plot of minority carrier lifetimes as a function of minority carrier concentrations.

12. The system of claim 11, wherein the minority carrier lifetimes are determined by surface recombination velocity at a heterointerface.

13. The system of claim 8, wherein the fill factor is determined as being low when the lifetime values increase as the minority carrier concentrations increase.

14. The system of claim 8, wherein the fill factor is determined as being high when the lifetime values decrease as the minority carrier concentrations increase.

* * * * *